(12) United States Patent
Trivedi et al.

(10) Patent No.: US 6,708,314 B2
(45) Date of Patent: Mar. 16, 2004

(54) CLOCK SKEW REDUCTION USING ACTIVE SHIELDS

(75) Inventors: Pradeep R. Trivedi, Sunnyvale, CA (US); Sudhakar Bobba, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 12 days.

(21) Appl. No.: 10/155,149

(22) Filed: May 24, 2002

(65) Prior Publication Data

US 2003/0221174 A1 Nov. 27, 2003

(51) Int. Cl.[7] .................. G06F 17/50; G06F 9/45; H01L 23/552
(52) U.S. Cl. .................. 716/2; 716/8; 716/10; 716/6; 257/659
(58) Field of Search .................. 716/2, 8, 10, 6; 257/659

(56) References Cited

U.S. PATENT DOCUMENTS 5,309,015 A * 5/1994 Kuwata et al. ............. 257/659

OTHER PUBLICATIONS

H. Kaul et al., Active Shielding of RLC Global Interconnects, Proceedings of the 8th ACM/IEEE International workshop on Timing Issues, pp. 98–104, Dec. 2002.*

Y. Massoud et al., Layout Techniques for Minimizing On–Chip Interconnect Self–Inductance, Proceedings of the 1998 Design Automation Conference, pp. 566–571, Jun. 1998.*

B. Victor et al., Bus Encoding to Prevent Crosstalk Delay, Proceedings of the 2001 IEEE/ACM International Conference on Computer–Aided Design, pp. 57–63 Nov. 2001.*

H. Kaul et al., Active Shields: A New Approach to Shielding Global Wires, Proceedings of the 12th ACM Great lakes Symposiu on VLSI, pp. 112–117, Apr. 2002.*

A. Kahng et al., On Switch Factor Based Analysis of Coupled RC Interconnects, 37th Conference of Design Automation, pp. 79–84, Jun. 2000.

* cited by examiner

Primary Examiner—A. M. Thompson
(74) Attorney, Agent, or Firm—Rosenthal & Osha L.L.P.

(57) ABSTRACT

A technique that uses active shields to reduce clock skew is provided. The technique uses a shield wire for shielding the signal wire, a driver stage for driving a leading clock signal on the shielding wire, and a signal wire buffer for driving a lagging clock signal on the signal wire, where the leading clock signal is driven onto the first shield wire a phase difference before the lagging clock signal is driven onto the signal wire.

12 Claims, 7 Drawing Sheets

CLOCK SKEW REDUCTION USING ACTIVE SHIELDS

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components of the computer system (10).

A clock signal is critical to the operation of a microprocessor-based computer system. The clock signal initiates and synchronizes the operation of almost all of the components of the typical computer system. As computers operate at increasing clock speeds, it becomes critical to ensure that clock signals on a microprocessor are provided to various logic elements on the microprocessor in an accurate and timely manner.

FIG. 2 shows a clock distribution network (20) for a microprocessor (12).

A reference clock (also known in the art as "system clock" and shown in FIG. 2 as ref_clk), which is typically generated from outside the microprocessor (12), serves as an input to a phase locked loop ("PLL") (15). Essentially, the PLL (15) uses feedback to maintain a specific phase relationship between its output (shown in FIG. 2 as chip_clk) and the reference signal. The chip clock from the PLL (15) is then distributed to one or more clock drivers/buffers (17), which, in turn, distribute the chip clock to a global clock grid (19), where the global clock grid (19) feeds the chip clock to various microprocessor components such as local clock grids (24) and a feedback loop (26) that feeds the chip clock back to the PLL (14). The local clock grids (24) feed the chip clock to base components of the microprocessor (12), such as latches (22) and flip-flops (28). However, due to one or more types of variations across the microprocessor, a particular clock signal may arrive at different parts of the chip at different times. The difference in the arrival of a clock signal at different logic elements due to system variations is referred to and known in the art as "clock skew."

Microprocessors are often fabricated on an integrated circuit (IC). Because signal wires within an IC are often in close proximity to each other, e.g., the signal wires driven by clock drivers/buffers (17) have a propensity to affect the behavior of each other. This occurs due to intrinsic capacitances (also referred to and known as "cross-coupling capacitance") that are formed between signal wires operating at different voltage levels. For example, some amount of cross-coupling capacitance is likely to be formed between two signal wires that are located relatively close to one another. If a voltage on one of the two signal wires changes, the cross-coupling capacitance will have a tendency to adversely affect the other signal. For example, when the voltage is raised on one of the two signal wires, i.e., transitioning to a "logic high," the cross coupling capacitance will tend to raise the voltage on the other signal wire, and when the voltage is reduced on one of the two signal wires, i.e., transitioning to a "logic low," the cross coupling capacitance will tend to reduce the voltage on the other signal wire. In other words, when one of the signal wires switches state, noise may be injected on the other signal, causing the other signal to glitch, i.e., an electrical spike occurs. Such undesired behavior on the non-switching signal may lead to performance degradation because the noise injected on the non-switching signal can propagate to other parts of the processor causing timing failures and/or circuit malfunction.

An approach that designers have used to combat such cross-coupling capacitance induced behavior involves the use of wire shielding technique, which involves placing shield wires adjacent to a signal wire ("shielding" the signal wire from other signals). The shield wires may maintain constant voltage. To this end, FIG. 3 shows a typical wire shielding technique. In FIG. 3, a logic stage (e.g., clock driver/buffer (17)) outputs on a signal wire (23) that is shielded by a first shield wire (25) and a second shield wire (26), where the first shield wire (25) is connected to logic high, i.e., a voltage source (29), and the second shield wire (26) is connected to logic low, i.e., ground (33). The clock driver/buffer (17) is also connected to the voltage source (35) and ground (39), respectively; however, the voltage source (35) and ground (39) of the logic stage (17) may be different from the voltage source (29) and ground (33) of the shield wires (25, 26). In any event, the placement of the shield wires (25, 26) cause capacitances (35, 37) to develop between the respective shield wires (25, 26) and the signal wire (23).

Because of such a wire shielding technique, other signals in close proximity to the signal wire (23) are not affected by the switching behavior of the signal wire (23) due to the fact that the signal wire (23) is shielded by shield wires (25, 26) that have constant values while the signal wire (23) is able to transition between high and low. Alternatively, the wire shielding technique lessens the effects of the switching behavior of other signals (not shown) on the signal wire (23) that are in close proximity to the signal wire (23). Typically, clock signals are shielded due to the close proximity of signal wires within an IC. This provides noise immunity to and from the clock signals.

Changes in the voltage value of the clock signal create charging and discharging events in capacitors associated with the signal wire on which the clock signal propagates. A capacitor with a potential difference across its terminals is considered to be a charged capacitor, and a capacitor with no potential difference across its terminals is considered to be a discharged capacitor. Therefore, a charging event is described as a process by which an increase in potential difference is induced across the terminals of a capacitor by delivering charge to the capacitor. A discharging event is described as a process by which a decrease in potential difference is induced across the terminals of a capacitor by removing the charge stored in the capacitor.

FIG. 4 shows an exemplary timing diagram corresponding to the wire shielding technique in FIG. 3. The behavior of the input signal of the clock signal, the output signal of the first shield wire (25), the output signal of the second shield wire (26), and the output signal of the signal wire (25) are given. The clock signal transitions between two voltage levels (high to low or low to high), the shield wires (25, 26) maintain a constant voltage of high and low, respectively, and the signal wire (23) outputs a copy of the clock signal with a delay of t1, some finite measure of time. The rise and fall time of the output signal of the signal wire (23) is slow compared to the clock signal as a result of characteristics of the logic stage (e.g., clock driver/buffer (17)) driving the clock signal, indicated by the sloped edges of the output signal of the signal wire (23).

Referring to FIG. 3, when the clock signal is high, the signal wire (23) is high, the second shield wire (26) is low, and the first shield (25) wire is high. There is no potential difference between the first shield wire (25) and the signal wire (23), therefore capacitors (35) are considered discharged; furthermore, there is a potential difference between the second shield wire (26) and the signal wire, (23) therefore capacitors (37) are considered charged.

When the clock signal is low, the signal wire (23) is low, the second shield wire (26) is low, and the first shield (25) wire is high. There is no potential difference between the second shield wire (26) and the signal wire (23), therefore capacitors (37) are considered discharged; furthermore, there is a potential difference between the first shield wire (25) and the signal wire (23), therefore capacitors (35) are considered charged.

In both high to low and low to high transitions a charging event in the capacitors (35, 37) occurs on at least one side of the signal wire (23) and may be considered an increase in the cross coupling capacitance the clock signal on the signal wire (23) experiences.

The presence of cross-coupling capacitance along with the resistance of the wires introduces a propagation delay. The wire propagation delay is dependent on the length of the wire, the resistance of the wire, the total capacitance of the wire, and the potential difference across the capacitors (35, 37). The greater the potential difference, the greater the propagation delay because of the length of time to charge the capacitors (35, 37). Because the clock skew is a measure of the signal propagation delay, signal propagation may cause a clock signal to arrive at relatively different time to different circuits. The function of the different circuits may not occur simultaneously as expected. Therefore, the microprocessor operation may have undesirable effects that may cause, among other things, performance degradation, inaccurate operation, and malfunction.

SUMMARY OF INVENTION

According to one aspect of the invention, an integrated circuit comprises a signal wire, a first shield wire for shielding the signal wire, a driver stage for driving a leading clock signal on the shielding wire, and a signal wire buffer for driving a lagging clock signal on the signal wire, where the leading clock signal is driven on the first shield wire a phase difference before the lagging clock signal is driven on the signal wire.

In another aspect of the invention, a method for reducing clock skew comprises shielding a signal wire with a first shield wire, driving a leading clock signal onto the first shield wire, and driving the leading clock signal onto the shield wire a phase difference before the driving of a lagging clock signal on the signal wire.

In another aspect of the invention, an apparatus for reducing clock skew comprises first shielding means for shielding a signal wire, first shield driving means for driving a leading clock signal onto the first shielding means, and signal driving means for driving a lagging clock signal onto the signal wire, where the first shield means drives before the signal driving means.

Other aspects and advantages of the invention will be apparent from the following description and the appended claims.

DETAILED DESCRIPTION

Figure 1:
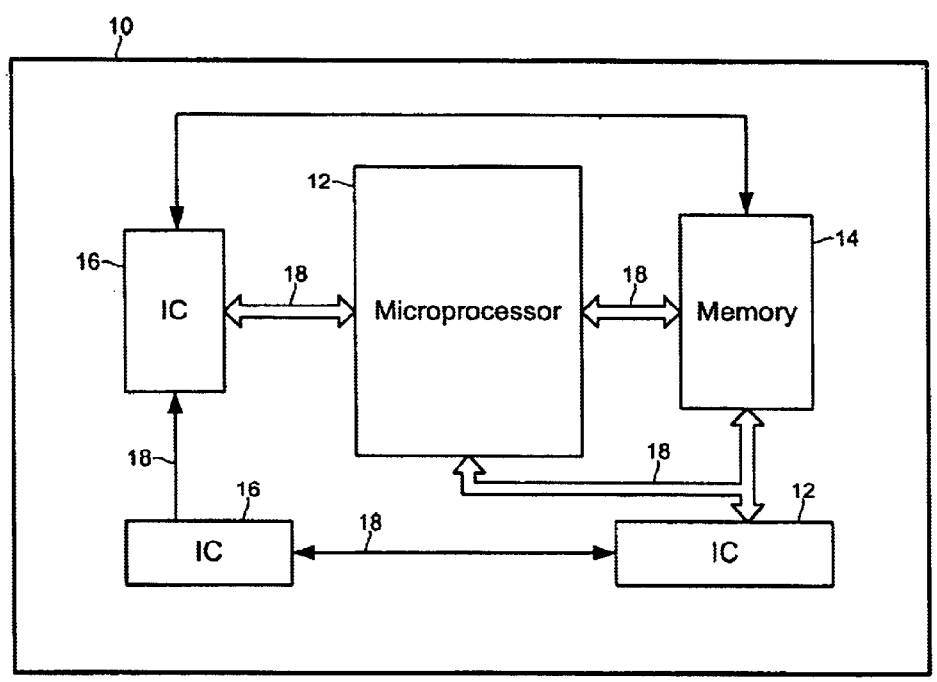
FIG. 1 shows a typical computer system.

Specific embodiments of the invention will now be described in detail with references to the accompanying figures. Like elements in the various figures are denoted by like reference numerals throughout the figures for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the present invention relate to a method and apparatus for reducing clock skew using shield wires driven by a clock signal. Typically, the shield wires are maintained at constant potential (i.e., two shield wires are maintained at high and low, respectively). This causes a potential difference to develop between the shield wires and the clock signal, which effectively increases the cross coupling capacitance (through charging events), which increases the propagation delay of the wire. Cross coupling capacitance may be reduced by minimizing the difference in the potential between the signal wire and shield wires (through discharging events).

The potential difference between the signal wire and the shield wires may produce discharging events by driving a phase shifted clock signal on the shield wires. The phase shifted clock signal is displaced relative to another clock signal of the same frequency. A leading clock signal refers to the clock signal that occurs "ahead" of another clock signal of the same frequency, where the lagging clock signal refers to the clock signal that occurs "behind" another clock signal of the same frequency. The phase difference, also called the phase angle, is conventionally defined as the number of degrees separating the leading clock signal and lagging clock signal.

Using a driver stage, a leading clock signal is driven onto the shield wires. The effective cross coupling capacitance between the signal wire and the shield wires may be significantly reduced because of a decrease in potential difference between the signal wire and the shield wires. The driver stage that drives the leading clock signal onto the shield wires produces "active" shield wires, i.e., shield wires that switch between high and low along with the lagging clock signal driven on the signal wire, which results in discharging events. Discharging events may be considered a decrease in cross coupling capacitance.

The presence of the cross coupling capacitance along with the resistance of the wires degrades the clock waveform as it propagates along the wire. The propagation delay is a byproduct of the degradation of the clock signal and, therefore, a reduction in cross-coupling capacitance results in a reduction of the degradation of the clock signal.

Accordingly, a reduction in the propagation delay, which is a measure of the clock skew, leads to a reduction in the clock skew.

Figure 5:
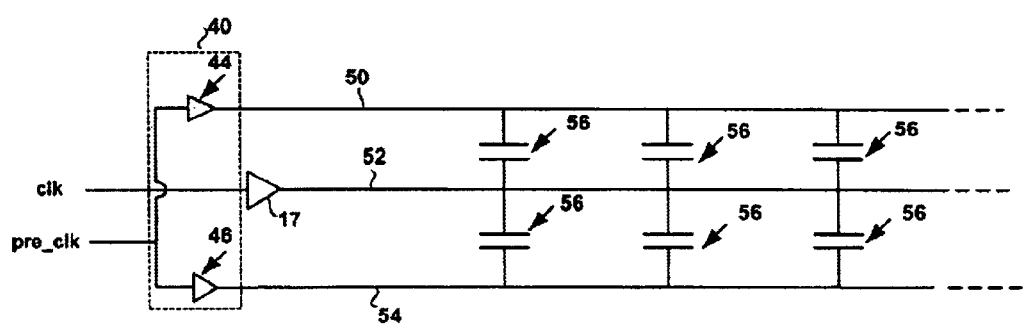
FIG. 5 shows an active wire shielding technique in accordance with an embodiment of the present invention.

FIG. 5 shows an exemplary active wire shielding technique in accordance with an embodiment of the present invention. In FIG. 5, a pre-driver logic stage (40) drives a leading clock signal through a first shield wire (50) and a second shield wire (54). In one or more embodiments, a phase difference of forty-five degrees to ninety degrees between the leading and the lagging clock signal. In one or more embodiments, the phase difference is produced in the PLL by a delay element (e.g., delay locked loop (DLL)). One skilled in the art can appreciate that a phase difference between a leading and lagging clock signal can be produced in a number of ways.

The driver stage is formed by two buffers (44, 46) that have a drive strength less than that of buffer (17). Accordingly, the rise times and fall times of the signals driven by buffers (44, 46) are slower than those driven by buffer (17).

The leading clock signal is input to the two buffers (44, 46). As mentioned above, the buffers (44, 46) produce a signal with slow rise and fall times relative to the rise and fall times of the buffer (17). The buffers (44, 46) output the leading clock signal on the first shield wire (50) by the buffer (44) and the second shield wire (54) by the buffer (46). The lagging clock signal is driven on the signal wire (52) by buffer (17). As can be seen, the signal wire (52) is between the first shield wire (50) and the second shield wire (54).

As the lagging clock signal driven on the signal wire (52) transition between high and low, the leading clock signal driven on the first shield wire (50) and the second shield wire (54) also transition between high and low. The first shield wire (50) and the second shield wire (54) transitioning substantially out of phase with the signal wire (52) causes capacitors (56) to be discharged which may be considered a reduction in the cross coupling capacitance (56) between the signal wire (52) and the first shield wire (50) and the second shield wire (54). The reduction in the cross coupling capacitance (56) reduces propagation delay, and thus, produces a reduction in clock skew.

Figure 6:
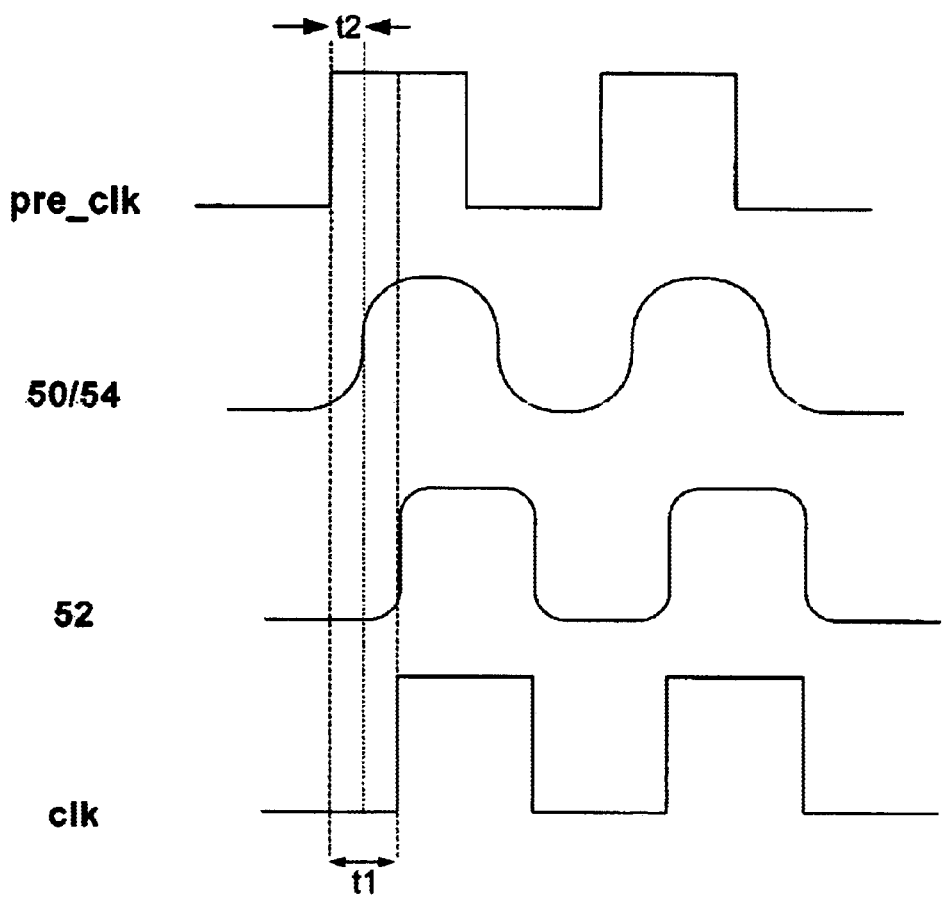
FIG. 6 shows a timing diagram of an active wire shielding technique in accordance with an embodiment of the present invention.

FIG. 6 shows a timing diagram of the active wire shielding technique in FIG. 5. An example of the leading clock signal (clk), the lagging clock signal (pre-clk), the output signal of the first shield wire (50), the output signal of the second shield wire (54), and the output signal of the signal path (52) are shown. The leading clock signal and the lagging clock signal transitions between two voltage levels (high to low or low to high) with a phase difference of ninety degrees. Thus, the rising edge of the leading clock signal occurs some finite amount of time, t1, before the lagging clock signal. In this example, when the phase difference is ninety degrees, the time, t1, is inversely proportional to one-quarter of the frequency.

The rise and fall time of the output signal of the signal path (52) and the shield wires (50, 54) is slow compared to the leading clock signal and the lagging clock signal as a result of the characteristics of the buffers (17, 44, 46) driving the leading clock signal and lagging clock signal, respectively. The effects of the buffers are indicated by the sloped edges of the output signal of the signal wire (52) and the output signal of the shield wires (50, 54). The edges of the output signal of the shield wires are more sloped than the output signal of the signal path (52) because of the drive strength of the buffers (44, 46) is less than the drive strength of the buffer (17). Further, the buffers (44, 46) produce a substantial delay of time, t2, and the buffer (17) produces a substantially small delay of time (not shown).

In one or more embodiments, the drive strength of the buffers (44, 46) may be considered when driving the leading clock signal through several stages of the previously mentioned clock distribution network (20). Each stage of the clock distribution network (20) may be replaced by the clock buffer (17). The phase difference may be substantially altered by the delay produced by driving the leading signal through series of buffers (44, 46), therefore the drive strength, the phase difference, and the number of stages the leading clock signal is driven may all be considered in the active shielding technique.

When the leading clock signal goes high in FIG. 5, the high enters the driver stage (40), the high is input to the two buffers (44, 46), and outputs the high onto the first shield wire (50) and the second shield wire (54), respectively. The buffer (17) outputs the lagging clock signal onto the signal wire (52), which goes high after some finite amount of time the leading clock signal goes high. The lagging clock signal on the signal wire (52) and the leading clock signal on the first shield wire (50) and second shield wire (54) are both high for some finite amount of time, therefore the potential difference is relatively small between the signal wire (52), the first shield wire (50), and the second shield wire (54) during that finite amount of time. This results in the discharging of capacitors (56), which may be considered a reduction in cross coupling capacitance.

When the leading clock signal goes high in FIG. 5, the low enters the driver stage (40), the low is input to the two buffers (44, 46), and outputs the low onto the first shield wire (50) and the second shield wire (54), respectively. The buffer (17) outputs the lagging clock signal onto the signal wire (52), which goes low after some finite amount of time the leading clock signal goes low. The lagging clock signal on the signal wire (52) and the leading clock signal on the first shield wire (50) and second shield wire (54) are both low for some finite amount of time, therefore the potential difference is relatively small between the signal wire (52), the first shield wire (50), and the second shield wire (54) during that finite amount of time. This results in the discharging of capacitors (56), which may be considered a reduction in cross coupling capacitance.

In both high to low and low to high transitions, a discharging event in the capacitors (56) occurs on both sides of the signal wire (52), which reduces the cross coupling capacitance the clock signal on the signal wire (52) experiences. The reduction in cross coupling capacitance reduces the degradation of the copy of the clock signal, and thus, a reduction in propagation delay, and a reduction in the clock skew is achieved.

In accordance with one or more embodiments, the first shield wire (50) and the second shield wire (54) may be left floating. Alternatively, the first shield wire (50) and the second shield wire (54) may be terminated by shorting the first shield wire (50) and the second shield wire (54) to the input of the clock signal.

Figure 2:
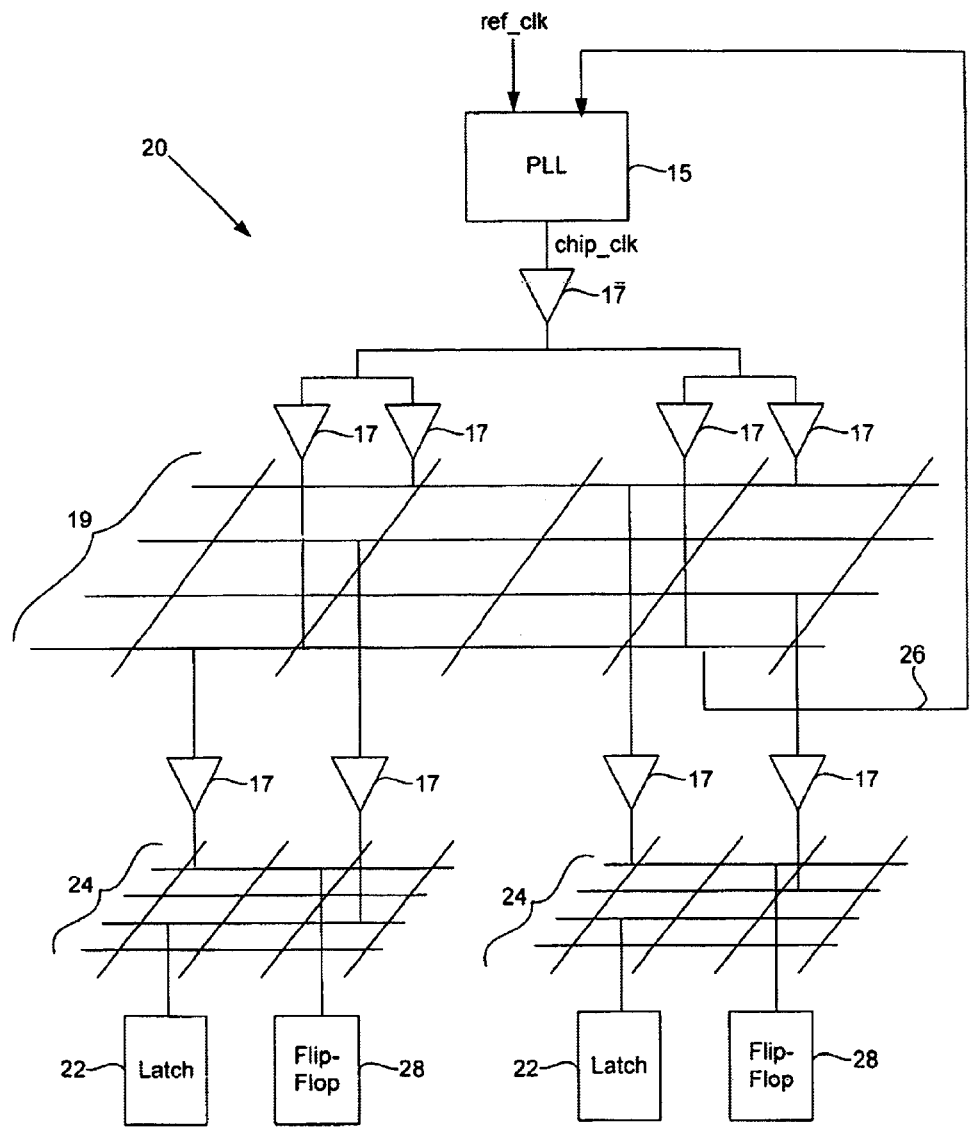
FIG. 2 shows a typical clock distribution network.
Figure 3:
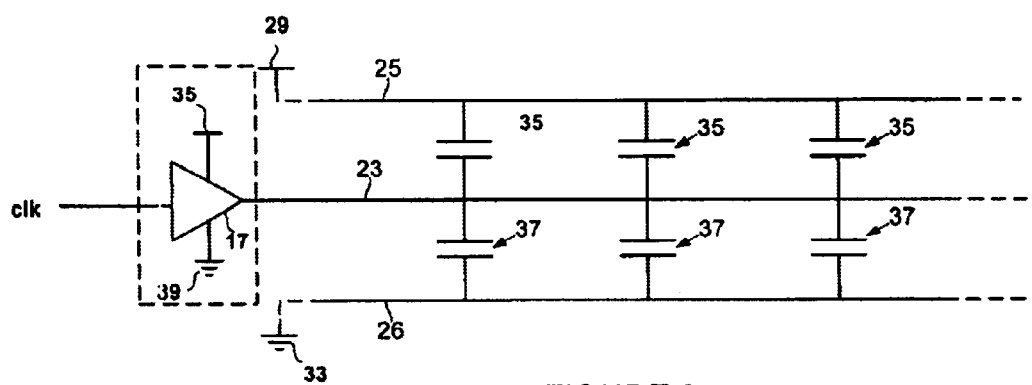
FIG. 3 shows a typical wire shielding technique.
Figure 4:
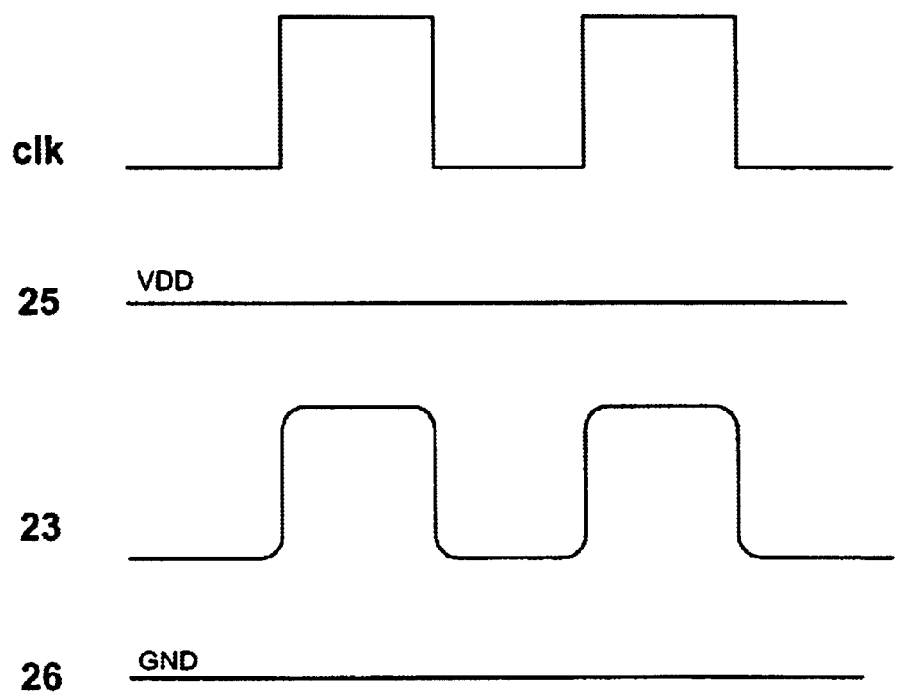
FIG. 4 shows a timing diagram of a typical wire shielding technique.
Figure 7:
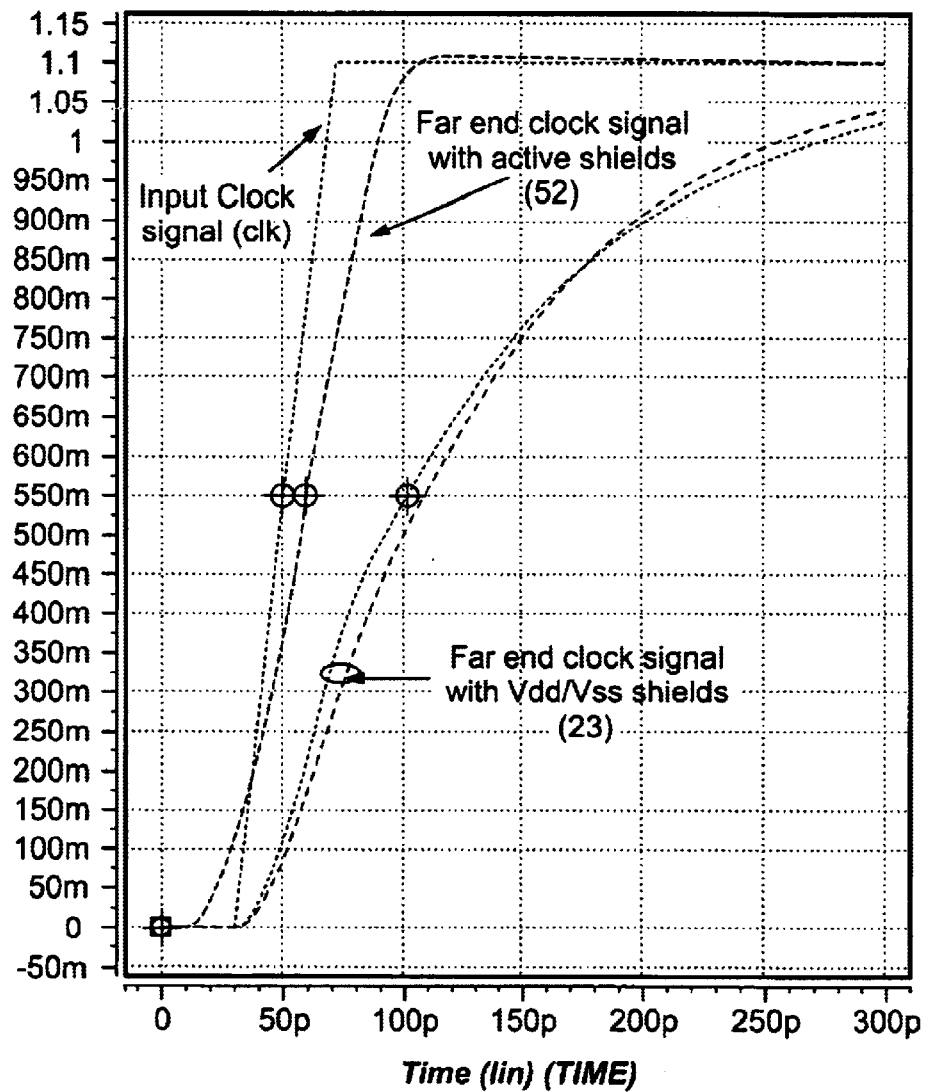
FIG. 7 shows a timing diagram of clock skew reduction using the active wire shielding technique.

FIG. 7 shows a timing diagram of clock skew reduction using the active wire shielding technique. The diagram shows the low to high transition of three signals: the input signal of the clock signal (referred to as the lagging clock signal in FIG. 5), output signal of the signal wire (52) in accordance with FIG. 5, and output signal of the signal wire (23) in accordance with FIG. 2. The "far end" of the output signal of the signal wire (52) is not degraded (the active wire shielding technique) compared to the "far end" of the output signal of the signal wire (23) (the typical wire shielding technique), which is substantially degraded from the input signal of the clock signal. The reduction in clock skew is the difference between the "far end" of the output signal of the signal wire (52) and the output signal of the signal wire (23). As seen in FIG. 8, the signal wire (23) is assumed to switch with an offset of 30 picoseconds (ps) and with a slope of 40 ps. The signal wire (52) is assumed to switch with an offset of 10 ps and a slope of 80 ps. The signal wire (52) is approximately an improvement of 5.8 times in delay.

The present invention uses an active wire shielding technique such that the driver stage that drives a clock signal is more likely to reduce clock skew. Advantages of the present invention may include one or more of the following. In one or more embodiments, shield wires with a driver stage may be used to reduce the propagation delay of the clock distribution network from the output of the PLL to the input of the latch. In general, the greater the reduction in the propagation delay, the greater the reduction in clock skew is produced. The clock skew introduced by process variation is reduced due to the reduction in propagation delay. The resistance and capacitor (RC) component is integral in clock distribution network using grid structures is also reduced. The rise and fall times are improved, resulting in a reduction of the "crowbar" current. Shield wires with a driver stage may provide noise immunity to and from clock signals, and carry return currents from transitions on clock lines. Those skilled in the art appreciate that the present invention may also include other advantages and features.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An integrated circuit comprising:
a signal wire;
a first shield wire for shielding the signal wire;
a driver stage for driving a leading clock signal onto the first shielding wire; and
a signal wire buffer for driving a lagging clock signal on the signal wire, wherein the leading clock signal is driven onto the first shield wire a phase difference before the lagging clock signal is driven onto the signal wire.

2. The integrated circuit of claim 1, further comprising:
a second shield wire for shielding the signal wire, wherein the driver stage drives the leading clock signal onto the second shield wire.

3. The integrated circuit of claim 2, wherein the driver stage comprises:
a first driver stage buffer for driving the leading clock signal onto the first shield wire; and
a second driver stage buffer for driving the leading clock signal onto the second shield wire.

4. An integrated circuit comprising:
a signal wire;
a first shield wire for shielding the signal wire;
a second shield wire for shielding the signal wire;
a driver stage comprising:
a first driver stage buffer for driving the leading clock signal onto the first shield wire, and
a second driver stage buffer for driving the leading clock signal onto the second shield wire,
wherein the driver stage drives the leading clock signal onto the second shield wire; and
a signal wire buffer for driving a lagging clock signal on the signal wire, wherein the leading clock signal is driven onto the first shield wire and the second shield wire a phase difference before the lagging clock signal is driven onto the signal wire,
wherein a drive strength of the first driver stage buffer and a drive strength of the second driver stage buffer are less than a drive strength of the signal wire buffer.

5. An integrated circuit comprising:
a signal wire;
a first shield wire for shielding the signal wire;
a driver stage for driving a leading clock signal onto the first shield wire; and
a signal wire buffer for driving a lagging clock signal on the signal wire, wherein the leading clock signal is driven onto the first shield wire a phase difference before the lagging clock signal is driven onto the signal wire,
wherein the phase difference is between forty-five degrees and ninety degrees.

6. The integrated circuit of claim 5, wherein the phase difference is produced by a delay element of a phase locked loop.

7. A method for reducing clock skew comprising:
shielding a signal wire with a first shield wire;
driving a leading clock signal onto the first shield wire; and
driving the leading clock signal onto the shield wire a phase difference before the driving of a lagging clock signal on the signal wire.

8. The method of claim 7, further comprising:
shielding the signal wire with a second shield wire; and
driving the leading clock signal onto the second shield wire, wherein the driving onto the second shield wire is the phase difference before the driving of the lagging clock signal onto the signal wire.

9. The method of claim 8, wherein the driving of the lagging clock signal onto the signal wire is performed by a signal wire buffer, the driving of the leading clock signal onto the first shield wire is performed by a first driver stage buffer, and wherein the driving of the leading clock signal onto the second shield wire is performed by a second driver stage buffer.

10. A method for reducing clock skew comprising:
shielding a signal wire with a first shield wire;
shielding the signal wire with a second shield wire; and
driving a leading clock signal onto the first shield wire and the second shield wire a phase difference before the driving of a lagging clock signal on the signal wire, wherein the driving of the lagging clock signal onto the signal wire is performed by a signal wire buffer, wherein the driving of the leading clock signal onto the first shield wire and the second shield wire is performed by a first driver stage buffer, and wherein the driving of the leading clock signal onto the second shield wire is performed by a second driver stage buffer, wherein a drive strength of the first driver stage buffer and a drive strength of the second driver stage buffer are less than a drive strength of the signal wire buffer.

11. An apparatus for reducing clock skew, comprising:

first shielding means for shielding a signal wire;

first shield driving means for driving a leading clock signal onto the first shielding means; and signal driving means for driving a lagging clock signal onto the signal wire, wherein the first shield driving means drives the leading clock signal onto the first shielding means before the signal driving means drives the lagging clock signal onto the signal wire.

12. The apparatus for reducing clock skew in claim 11, further comprising:

a second shielding means for shielding the signal wire; and a second shield driving means for driving the leading clock signal onto the second shielding means, wherein the second shield driving means drives the leading clock signal onto the second shielding means before the signal driving means drives the lagging clock signal onto the signal wire.

* * * * *